United States Patent
Choi et al.

(10) Patent No.: US 7,294,925 B2
(45) Date of Patent: Nov. 13, 2007

(54) OPTICAL SCANNER PACKAGE HAVING HEATING DAM

(75) Inventors: Won-kyoung Choi, Suwon-si (KR); Young-chul Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 152 days.

(21) Appl. No.: 11/315,242

(22) Filed: Dec. 23, 2005

(65) Prior Publication Data

US 2006/0164631 A1  Jul. 27, 2006

(30) Foreign Application Priority Data

Jan. 21, 2005 (KR) ............... 10-2005-0005818

(51) Int. Cl.
*H01L 23/10* (2006.01)
*H01L 23/12* (2006.01)

(52) U.S. Cl. .............. 257/710; 257/704; 257/680; 257/684; 257/705; 257/E23.193; 257/924

(58) Field of Classification Search .......... 257/680, 257/684, 700–705, 710, 924, E21.5, E21.501, 257/E23.18–E23.193
See application file for complete search history.

(56) References Cited

U.S. PATENT DOCUMENTS

| 5,256,901 | A  | * | 10/1993 | Ohashi et al. ............ 257/680 |
| 5,278,429 | A  | * | 1/1994  | Takenaka et al. ......... 257/678 |
| 6,956,283 | B1 | * | 10/2005 | Peterson .................. 257/680 |
| 7,173,331 | B2 | * | 2/2007  | Matsubara et al. ........ 257/704 |

* cited by examiner

*Primary Examiner*—Jasmine Clark
(74) *Attorney, Agent, or Firm*—Buchanan Ingersoll & Rooney PC

(57) ABSTRACT

An optical scanner package having a heating dam is provided. The optical scanner package having a heating dam includes: an optical scanner on which a mirror surface is formed; a ceramic package in which the optical scanner is installed at the bottom of a cavity thereof; a glass lid covering a sidewall of the ceramic package; a heating dam formed on the sidewall of the ceramic package; and solder on the heating dam sealing between the glass lid and the sidewall of the ceramic package. The heating dam locally heats the solder to form hermetic sealing.

11 Claims, 3 Drawing Sheets

OPTICAL SCANNER PACKAGE HAVING HEATING DAM

CROSS-REFERENCE TO RELATED PATENT APPLICATIONS

This application claims the benefit of Korean Patent Application No. 10-2005-0005818, filed on Jan. 21, 2005, in the Korean Intellectual Property Office, the disclosure of which is incorporated herein in its entirety by reference.

BACKGROUND OF THE DISCLOSURE

1. Field of the Disclosure

The present disclosure relates to an optical scanner package, and more particularly, to an optical scanner package having a dam that can be locally heated.

2. Description of the Related Art

An optical scanner having the structure of a micro-electro-mechanical system (MEMS) using an electrostatic effect created by a comb-typed electrode structure has been used as an optical scanner for scanning a laser beam in a projection TV or laser TV, etc. In the optical scanner, a stage is suspended on a substrate and a mirror surface is formed on the stage. The optical scanner needs hermetic sealing so as to be protected from an environmental change.

FIG. 1 is a cross-sectional view of a structure of a conventional optical scanner package. Referring to FIG. 1, an optical scanner 20 fabricated by an MEMS technology is die-bonded on a bottom of a ceramic package 10 using an adhesive 14, and electrode pads 21 formed on the optical scanner 20 are connected to electrode pads 32 formed on the package 10 via a wire 22. The electrode pad 32 is electrically connected to a lead line 30. An upper portion of a sidewall 12 of the package 10 is coupled to and sealed by a glass lid 40 by the use of solder 42. When the optical scanner 20 instead of a chip is used in an optical scanner package having the above structure, a mirror 24 formed on the surface of the optical scanner 20 scans image laser that has passed through the glass lid 40, thereby scanning an image.

In order to form the structure of the solder 42, if the solder 42 is interposed between the glass lid 40 and the package 10 and the optical scanner package is heated to melt the solder 42, the optical scanner 20 may be thermally damaged by the heating to a high temperature. In addition, the thickness of the solder 42 is not uniform and the solder 42 may melt and flow into a cavity so that the yield of the optical scanner package may be reduced.

In order to perform a good junction and hermetic sealing between the glass lid and the optical scanner package, it is known that it is preferable to increase a contact area therebetween and to make the thicknesses of the solder thin.

SUMMARY OF THE DISCLOSURE

The present invention may provide an optical scanner package having a heating dam which is interposed between a ceramic package and a glass lid, whereby solder is placed on the dam and the solder is locally heated by the heating dam and thereby reduces the thermal damage that occurs when the glass lid is joined to the ceramic package.

The present invention also may provide an optical scanner package having a heating dam in which hermetic sealing is well performed utilizing the configuration of the dam.

According to an aspect of the present invention, there may be provided an optical scanner package having a heating dam, the optical scanner package including: an optical scanner on which a mirror surface is formed; a ceramic package in which the optical scanner is installed at the bottom of a cavity thereof; a glass lid covering a sidewall of the ceramic package; a heating dam formed on the sidewall of the ceramic package; and solder on the heating dam sealing between the glass lid and the sidewall of the ceramic package.

The heating dam may include dams formed at both-sides on the sidewall of the ceramic package and a concave portion formed between the dams on the sidewall of the ceramic package, and the solder may cover the concave portion and the dams.

The heating dam may be formed at both-sides on the sidewall of the ceramic package, and the solder may cover the dams and the sidewall between the dams.

The heating dam may be formed at an inner side on the sidewall of the ceramic package, and the solder may cover the dams and an upper portion of the sidewall.

The heating dam may be fabricated of a material selected from a group consisting of Ni, Al, Au, Pt, Ni alloy, Al alloy, Au alloy, and Pt alloy.

The ceramic package may be fabricated of alumina or AlN.

According to another aspect of the present invention, there is provided an optical scanner package having a heating dam, the optical scanner package including: an optical scanner on which a mirror surface is formed; a ceramic package in which the optical scanner is installed on a bottom of a cavity thereof; a glass lid covering a sidewall of the ceramic package; a heating layer formed on the sidewall of the ceramic package; and solder interposed between the heating layer and the glass lid and sealing between the glass lid and the ceramic package.

A dam may be formed at both-sides of an upper portion of the ceramic package.

A dam may be formed at an inner side of the upper portion of the ceramic package.

BRIEF DESCRIPTION OF THE DRAWINGS

The above and other aspects of the present invention will become further apparent in the following exemplary embodiments thereof with reference to the attached drawings in which.

DETAILED DESCRIPTION OF THE EXEMPLARY EMBODIMENTS

Hereinafter, the configuration of an optical scanner package having a heating dam will be described in detail by explaining exemplary embodiments of the invention with reference to the attached drawings.

Figure 1:
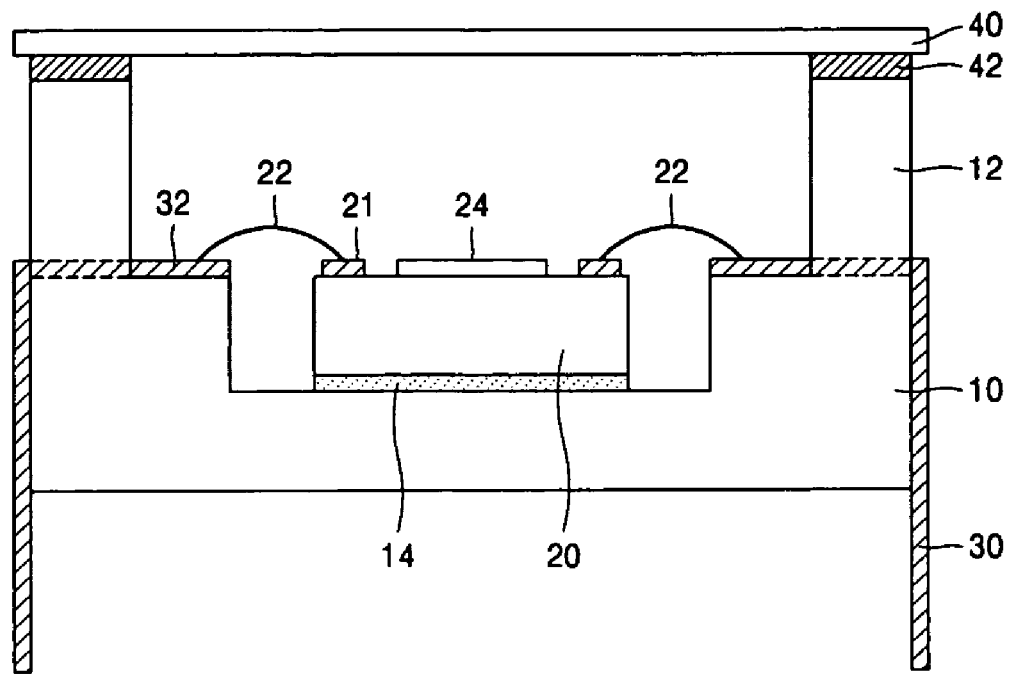
FIG. 1 is a cross-sectional view of a conventional optical scanner package.
Figure 2:
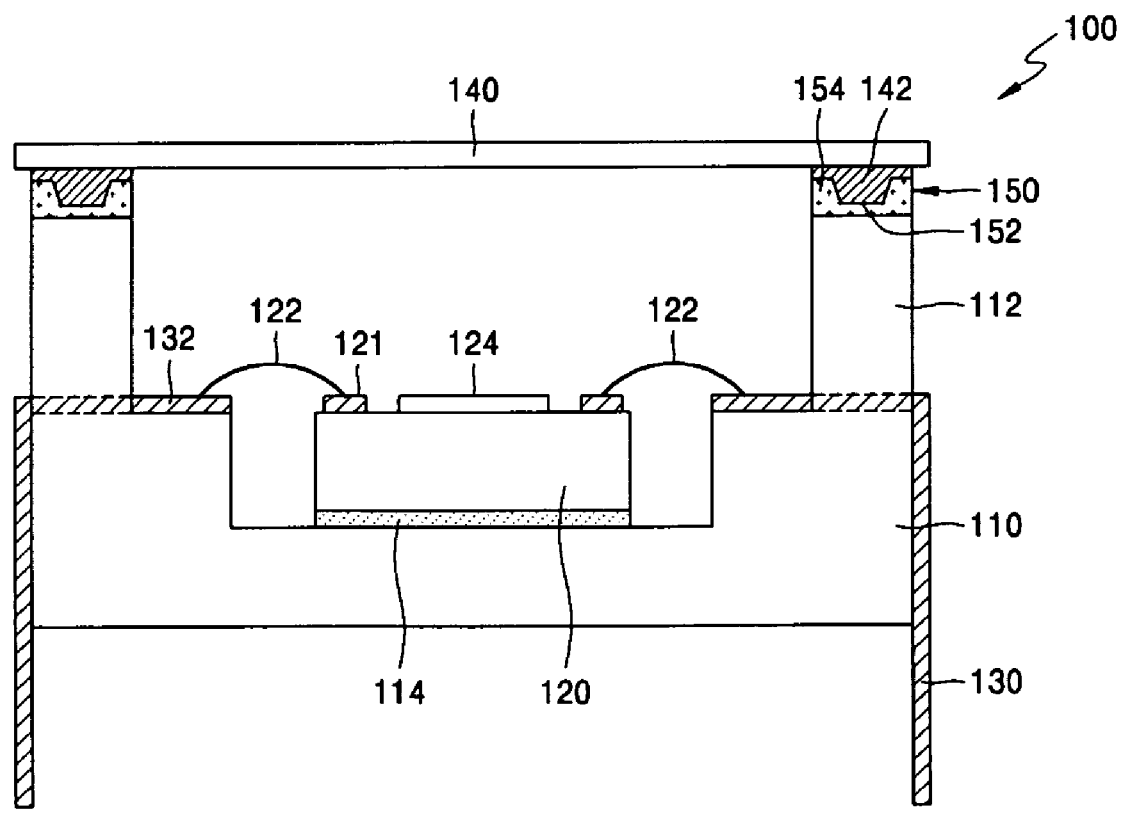
FIG. 2 is a cross-sectional view of an optical scanner package having a heating dam according to an embodiment of the present invention.

FIG. 2 is a cross-sectional view of an optical scanner package having a heating dam according to an embodiment of the present invention. Referring to FIG. 2, an optical scanner package 100 includes a ceramic package 110 in which a cavity is formed, an optical scanner 120 disposed at the bottom of the ceramic package 110, a glass lid 140 which covers an upper portion of the ceramic package 110, and solder 142 and a heating dam 150, which are interposed between the ceramic package 110 and the glass lid 140.

The bottom and a sidewall 112 of the ceramic package 110 form the cavity, and the optical scanner 120 is die-bonded to the bottom of the ceramic package 110 using an adhesive 114. A plurality of electrode pads 132 are formed at portions in the ceramic package 110 exposed by the cavity for electrically connecting to an outside. Each of the electrode pads 132 is connected to a lead 130 exposed to the outside of the ceramic package 110. The ceramic package 110 may be fabricated of alumina or AlN.

A mirror surface 124 for reflecting a laser beam is formed on an upper surface of the optical scanner 120. The mirror surface 124 is one-axis or two-axis driven by driving a stage (not shown). The stage is driven by an electrostatic force between a driving comb electrode (not shown) and a fixed comb electrode (not shown) and a restoring force of a torsion bar (not shown) for supporting the stage. An electrode pad 121 for supplying electricity to the driving comb electrode and the fixed comb electrode is formed on the optical scanner 120. The electrode pad 121 may be bonded to the electrode pad 132 using a wire 122.

The heating dam 150 is formed on an upper portion of the sidewall 112 of the ceramic package 110, and the solder 142 is formed on the upper portion of the heating dam 150. A concave portion 152 is formed in the center of the heating dam 150 and both edges of the concave portion 152 protrude so that a dam 154 is formed. The heating dam 150 is patterned and formed using a material selected from a group consisting of Ni, Al, Au, Pt, Ni alloy, Al alloy, Au alloy, and Pt alloy.

The solder 142 is adhered to the glass lid 140 as a preform in advance and the glass lid 140 is aligned on the ceramic package 110 so that the solder 142 is placed in the concave portion 152. Alternatively, the solder 142 may be aligned so that the glass lid 140 and the ceramic package 110 contact each other when the solder 142 is coated on the glass lid 140 or the concave portion 152.

Subsequently, a predetermined voltage is applied to the heating dam 150 and the heating dam 150 is heated. Thus, the solder 142 is melted and seals the heating dam 150 and the glass lid 140. In this state, part of the solder 142 may cover the upper portion of the heating dam 150. Since the structure of the solder 142 contacts the glass lid 140 and the upper portion of the sidewall 112 of the ceramic package 110 in a wide region, sealing is well performed. In addition, since a height of the solder 142 between the glass lid 140 and the sidewall 112 is very low, this helps to reduce the probability of the gas permeation. In addition, the solder 142 is effectively prevented from being flowed into the cavity by the dam 154.

Figure 3:
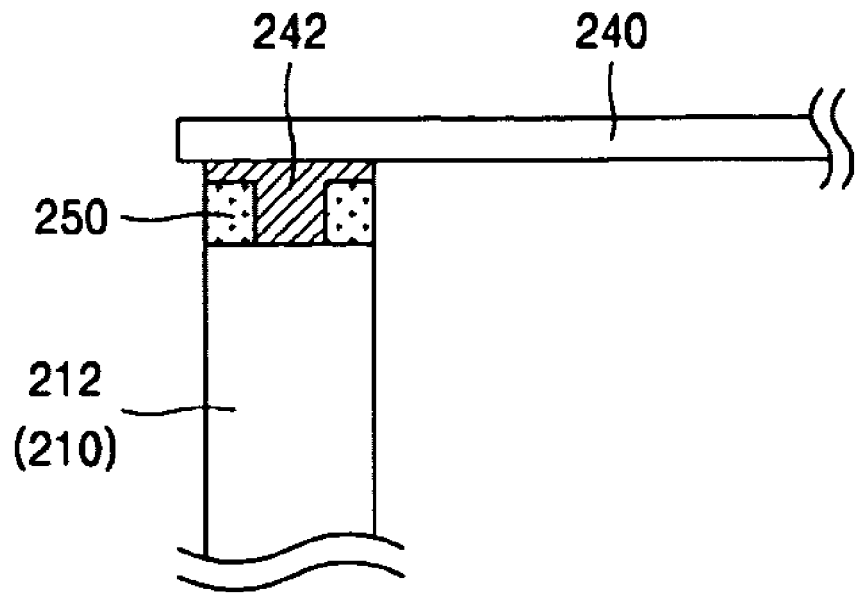
FIG. 3 is an enlarged cross-sectional view of part of an optical scanner package having a heating dam according to another embodiment of the present invention.

FIG. 3 is an enlarged cross-sectional view of part of an optical scanner package having a heating dam according to another embodiment of the present invention. The same names are used for substantially the same elements as those shown in FIG. 2, and a detailed description thereof is omitted.

Referring to FIG. 3, two heating dams 250 are formed at both-sides on a sidewall 212 of a ceramic package 210, and solder 242 is formed on the heating dams 250 to cover the upper portion of the sidewall 212 and the heating dams 250. The upper portion of the solder 242 contacts a lower portion of the glass lid 240.

The solder 242 may be placed as a preform or an injected form between the heating dams 250. The solder 242 is disposed between the sidewall 212 and the glass lid 240 and is melted between the heating dams 250 by heating the heating dams 250.

Figure 4:
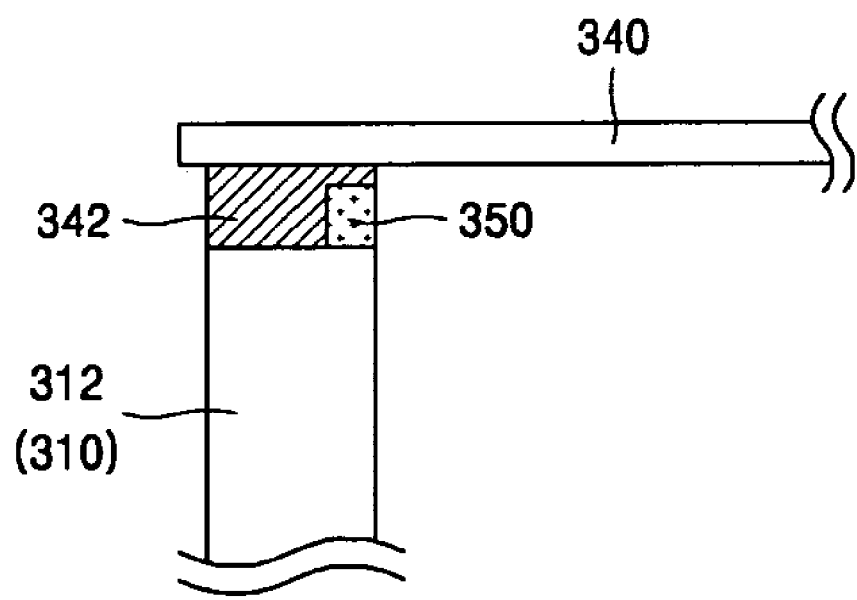
FIG. 4 is an enlarged cross-sectional view of part of an optical scanner package having a heating dam according to a further embodiment of the present invention.

FIG. 4 is an enlarged cross-sectional view of part of an optical scanner package having a heating dam according to another embodiment of the present invention. The same names are used for substantially the same elements as those shown in FIGS. 2 and 3, and a detailed description thereof is omitted.

Referring to FIG. 4, a heating dam 350 is formed at an inner side on a sidewall 312 of a ceramic package 310, and solder 342 is formed on the sidewall 312 and the heating dam 350. An upper portion of the solder 342 contacts a lower portion of the glass lid 340.

The solder 342 may be adhered to the glass lid 340 as a preform and bonded to the ceramic package 310. Alternatively, the solder 342 may be disposed between the glass lid 340 and the sidewall 312 in a predetermined manner coated on the glass lid 340 or the upper portion of the sidewall 312. The solder 342 forms hermetic sealing between the glass lid 340 and the sidewall 312 by heating the heating dam 350.

Figure 5:
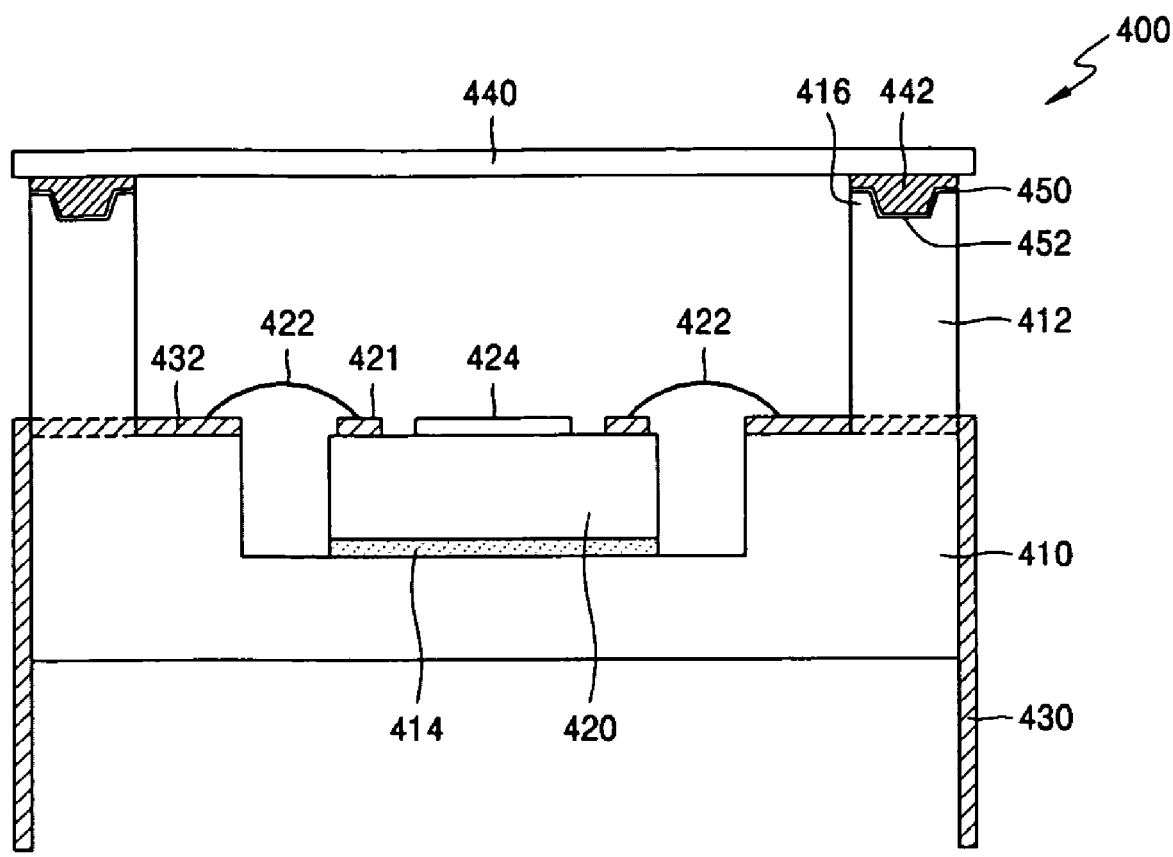
FIG. 5 is a cross-sectional view of an optical scanner package having a heating dam according to a further embodiment of the present invention.

FIG. 5 is a cross-sectional view of an optical scanner package having a heating dam according to another embodiment of the present invention. Referring to FIG. 5, an optical scanner package 400 includes a ceramic package 410 in which a cavity is formed, an optical scanner 420 disposed on the bottom of the ceramic package 410, a glass lid 440 which covers the upper portion of the ceramic package 410, a heating layer 450 formed on an upper portion of a sidewall 412 of the ceramic package 410, and solder 442 interposed between the heating layer 450 and the glass lid 440.

The bottom and the sidewall 412 of the ceramic package 410 form the cavity, and the optical scanner 420 is die-bonded to the bottom of the ceramic package 410 using an adhesive 414. A plurality of electrode pads 432 are formed at areas in the ceramic package 410 exposed by the cavity for electrically connecting on an outside. Each of the electrode pads 432 is connected to a lead 430 exposed to the outside of the ceramic package 410. The ceramic package 410 may be fabricated of alumina or AlN.

A mirror surface 424 for reflecting a laser beam is formed on an upper surface of the optical scanner 420. The mirror surface 424 is one-axis or two-axis driven by driving a stage (not shown). The stage is driven by an electrostatic force between a driving comb electrode (not shown) and a fixed comb electrode (not shown) and a restoring force of a torsion bar (not shown) for supporting the stage. An electrode pad 421 for supplying electricity to the driving comb electrode and the fixed comb electrode is formed on the optical scanner 420. The electrode pad 421 may be bonded to the electrode pad 432 using a wire 422.

A dam 416 having a predetermined height is formed at both-sides of the upper portion of the sidewall 412 of the ceramic package 410. The heating layer 450 is deposited in the shape of the upper portion of the sidewall 412. A concave portion 452 is formed in a center of the upper portion of the sidewall 412 and the heating layer 450 and both edges of the concave portion 452 are convex. The heating layer 450 is formed using a material selected from the group consisting of Ni, Al, Au, Pt, Ni alloy, Al alloy, Au alloy, and Pt alloy.

The solder 442 is adhered to the glass lid 440 as a perform and the glass lid 440 is aligned on the ceramic package 410 so that the solder 442 is placed in the concave portion 452. Alternatively, the solder 442 may be aligned so that the glass lid 440 and the ceramic package 410 contact each other when the solder 442 is coated on the glass lid 440 or the concave portion 452.

A predetermined voltage is applied to the heating layer 450 and the heating layer 450 is heated. Thus, the solder 442 is melted and seals the heating layer 450 and the glass lid 440. In this state, part of the solder 442 may cover the upper portion of the heating layer 450. Since the structure of the solder 442 contacts an upper portion of the glass lid 440 and the sidewall 412 of the ceramic package 410 in a wide region, sealing is well performed. In addition, since a height of the solder 442 between the glass lid 440 and the sidewall 412 is very low, this helps to make a hermetic sealing. In addition, the solder 442 is effectively prevented from flowing into the cavity by the dam 416.

Figure 6:
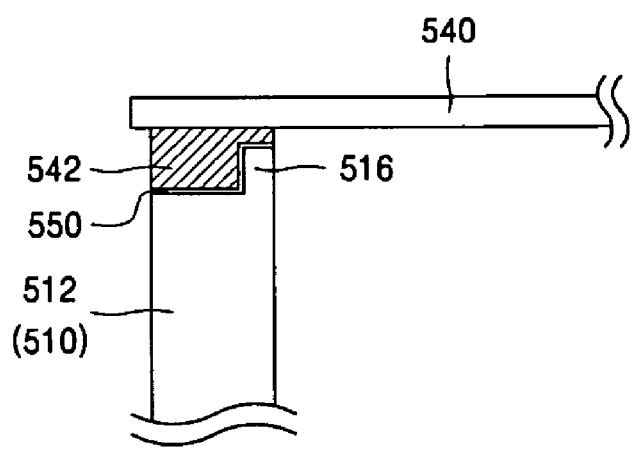
FIG. 6 is an enlarged cross-sectional view of part of an optical scanner package having a heating dam according to a further embodiment of the present invention.

FIG. 6 is an enlarged cross-sectional view of part of an optical scanner package having a heating dam according to another embodiment of the present invention. The same names are used for substantially the same elements as those shown in FIGS. 2 through 5, and a detailed description thereof is omitted.

Referring to FIG. 6, a dam 516 is formed at an inner side of an upper portion of a sidewall 512 of a ceramic package 510, and a heating layer 550 that covers the dam 516 is formed on the upper portion of the sidewall 512. Solder 542 is interposed between the heating layer 550 and the glass lid 540. an upper portion of the solder 542 contacts a lower portion of the glass lid 540.

The solder 542 may be adhered to the glass lid 540 as a preform and bonded to the ceramic package 510. Alternatively, the solder 542 may be disposed between the glass lid 540 and the sidewall 512 in a predetermined manner coated on the glass lid 540 or the upper portion sidewall 512. The solder 542 forms hermetic sealing between the glass lid 540 and the sidewall 512 by heating the heating layer 550.

As described above, in the optical scanner package having a heating dam according to the present invention, solder is locally heated using a heating dam or a heating layer such that the optical scanner can be protected from thermal damage when a glass lid is bonded to a package and the solder is prevented from flowing into a cavity. In addition, the contact area between the glass lid and the optical scanner package is increased, the adherence is increased, simultaneously the thickness of the solder between the dam and the glass lid is reduced, and the sealing property is improved. As a result, the reliability and yield of a product can be improved.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. An optical scanner package having a heating dam, the optical scanner package comprising:
   an optical scanner on which a mirror surface is formed;
   a ceramic package in which the optical scanner is installed at the bottom of a cavity thereof;
   a glass lid covering a sidewall of the ceramic package;
   a heating dam formed on the sidewall of the ceramic package; and
   solder on the heating dam sealing between the glass lid and the sidewall of the ceramic package.

2. The optical scanner package having a heating dam of claim 1, wherein the heating dam includes dams formed at both-sides on the sidewall of the ceramic package and a concave portion formed between the dams on the sidewall of the ceramic package, and the solder covers the concave portion and the dams.

3. The optical scanner package having a heating dam of claim 1, wherein the heating dam is formed at both-sides on the sidewall of the ceramic package, and the solder covers the dams and the sidewall between the dams.

4. The optical scanner package having a heating dam of claim 1, wherein the heating dam is formed at an inner side on the sidewall of the ceramic package, and the solder covers the dams and an upper portion of the sidewall.

5. The optical scanner package having a heating dam of claim 1, wherein the heating dam is fabricated of a material selected from a group consisting of Ni, Al, Au, Pt, Ni alloy, Al alloy, Au alloy, and Pt alloy.

6. The optical scanner package having a heating dam of claim 1, wherein the ceramic package is fabricated of alumina or AlN.

7. An optical scanner package having a heating dam, the optical scanner package comprising:
   an optical scanner on which a mirror surface is formed;
   a ceramic package in which the optical scanner is installed at the bottom of a cavity thereof;
   a glass lid covering a sidewall of the ceramic package;
   a heating layer formed on the sidewall of the ceramic package; and
   solder interposed between the heating layer and the glass lid and sealing between the glass lid and the ceramic package.

8. The optical scanner package having a heating dam of claim 7, wherein a dam is formed at both-sides of an upper portion of the ceramic package.

9. The optical scanner package having a heating dam of claim 7, wherein a dam is formed at an inner side of the upper portion of the ceramic package.

10. The optical scanner package having a heating dam of claim 7, wherein the heating layer is fabricated of a material selected from a group consisting of Ni, Al, Au, Pt, Ni alloy, Al alloy, Au alloy, and Pt alloy.

11. The optical scanner package having a heating dam of claim 1, wherein the ceramic package is fabricated of alumina or AlN.

* * * * *